(12) United States Patent
Wicki et al.

(10) Patent No.: US 7,609,092 B2
(45) Date of Patent: Oct. 27, 2009

(54) AUTOMATIC PHASE-DETECTION CIRCUIT FOR CLOCKS WITH KNOWN RATIOS

(75) Inventors: Thomas Wicki, Palo Alto, CA (US); Bharat Daga, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 85 days.

(21) Appl. No.: 12/018,557

(22) Filed: Jan. 23, 2008

(65) Prior Publication Data

US 2009/0184735 A1 Jul. 23, 2009

(51) Int. Cl.
*G01R 29/00* (2006.01)
*H03D 3/00* (2006.01)
*H03D 9/00* (2006.01)

(52) U.S. Cl. .................... 327/2; 327/3; 327/12
(58) Field of Classification Search ............ 327/2, 327/3, 12
See application file for complete search history.

(56) References Cited

U.S. PATENT DOCUMENTS 7,073,098 B2 * 7/2006 Kozaki .................. 714/700

OTHER PUBLICATIONS

Author Unknown, "Clock Domain Crossing", Technical Paper, Cadence Design Systems, Inc., 2004.

Author Unknown, "Digital comparator", http://en.wikipedia.org/wiki/Digital_comparator.

Author Unknown, "Metastability in electronics", http://en.wikipedia.org/wiki/Metastability_in_electronics, at least as early as Jul. 11, 2007.

Author Unknown, "Shift register", http://en.wikipedia.org/wiki/Shift_register, at least as early as Jul. 11, 2007.

Semeraro et al., "Energy-Efficient Processor Design Using Multiple Clock Domains with Dynamic Voltage and Frequency Scaling", Departments of Computer Science and of Electrical and Computer Engineering, University of Rochester, at least as early as the filing date of the application.

* cited by examiner

*Primary Examiner*—Lincoln Donovan
*Assistant Examiner*—John W Poos
(74) *Attorney, Agent, or Firm*—Dorsey & Whitney LLP

(57) ABSTRACT

An automatic phase detection circuit for generating an internal synchronization signal when two clock input signals achieve a certain phase relationship. No external reference signal is required. The logic state of one clock is sampled on the active edge of the other clock and stored in a shift register. The content of the shift register is compared to a pre-defined signature and a sync signal is generated when the content matches the pre-defined signature. A mask register may be used to define which bits of the shift register and pre-defined signature are compared.

22 Claims, 10 Drawing Sheets

| 90 ↘ | SHIFT REGISTER | | | | | | | | | |
|---|---|---|---|---|---|---|---|---|---|---|
| | BIT(0) | BIT(1) | BIT(2) | BIT(3) | BIT(4) | BIT(5) | BIT(6) | BIT(7) | BIT(8) | SYNC |
| RESET | 0 | 0 | 0 | 0 | 0 | 0 | 0 | 0 | 0 | 0 |
| | 0 | 0 | 0 | 0 | 0 | 0 | 0 | 0 | 0 | 0 |
| | 1 | 0 | 0 | 0 | 0 | 0 | 0 | 0 | 0 | 0 |
| | 0 | 1 | 0 | 0 | 0 | 0 | 0 | 0 | 0 | 0 |
| | 1 | 0 | 1 | 0 | 0 | 0 | 0 | 0 | 0 | 0 |
| | 0 | 1 | 0 | 1 | 0 | 0 | 0 | 0 | 0 | 0 |
| | 1 | 0 | 1 | 0 | 1 | 0 | 0 | 0 | 0 | 0 |
| | 0 | 1 | 0 | 1 | 0 | 1 | 0 | 0 | 0 | 0 |
| | 1 | 0 | 1 | 0 | 1 | 0 | 1 | 0 | 0 | 0 |
| | 0 | 1 | 0 | 1 | 0 | 1 | 0 | 1 | 0 | 1 |
| | 0 | 0 | 1 | 0 | 1 | 0 | 1 | 0 | 1 | 0 |
| | 1 | 0 | 0 | 1 | 0 | 1 | 0 | 1 | 0 | 0 |
| | 0 | 1 | 0 | 0 | 1 | 0 | 1 | 0 | 1 | 0 |
| | 1 | 0 | 1 | 0 | 0 | 1 | 0 | 1 | 0 | 0 |
| | 0 | 1 | 0 | 1 | 0 | 0 | 1 | 0 | 1 | 0 |
| | 1 | 0 | 1 | 0 | 1 | 0 | 0 | 1 | 0 | 0 |
| | 0 | 1 | 0 | 1 | 0 | 1 | 0 | 0 | 1 | 0 |
| | 1 | 0 | 1 | 0 | 1 | 0 | 1 | 0 | 0 | 0 |
| | 0 | 1 | 0 | 1 | 0 | 1 | 0 | 1 | 0 | 1 |
| ↓ INCREASING TIME | 0 | 0 | 1 | 0 | 1 | 0 | 1 | 0 | 1 | 0 |

AUTOMATIC PHASE-DETECTION CIRCUIT FOR CLOCKS WITH KNOWN RATIOS

FIELD OF THE INVENTION

Aspects of the present invention relate to integrated circuits. More particularly, aspects of the present invention relate to clock distribution and phase detection circuits.

BACKGROUND

Clock signals may be propagated across an integrated circuit or from one integrated circuit to another integrated circuit to enable reliable data transfer from one point to another point. The propagation of clock signals and data signals generally has to satisfy certain timing constraints for reliable data transfers. Meeting such timing constraints may impose increasing challenges on clock distribution as clock frequencies increase and integrated circuit feature sizes shrink.

Clock distribution in a single clock domain may encounter growing challenges as the clock frequency of an integrated circuits increases and circuit feature sizes shrink. Use of multiple clock domains, each with its own clock frequency, may also encounter problems when data signals have to be propagated between clock domains. Violation of the set-up and hold times of sequential circuit elements such as flip-flops in the receiving clock domain may result in metastable behavior of the sequential circuit elements (i.e., the output of the element can hover between a logic zero and a logic one state for longer than a clock cycle). Such metastable behavior may result in the loss of data and/or data instability.

Data signals may be transferred asynchronously (i.e., data is transferred at irregular intervals without using a common clock) within an integrated circuit or between integrated circuits. Reliable data transmission is generally needed when the data is asynchronously transferred. FIG. 1 depicts an asynchronous data transfer scenario between a first system 2, controlled by a first clock 3, that transmits N-bit data words 4 to a second system 5, controlled by a second clock 6. The first clock 3 may be propagated between systems 2, 5 as a separate clock signal 7 or may be encoded in the data words. The systems 2, 5 may represent separate chips or separate units within an integrated circuit employing asynchronous clocks 3, 6 (i.e., the two clocks may have a varying phase relationship or may be unrelated). The propagation of the clock and the data signals generally have to satisfy certain timing constraints to achieve reliable data transfer between the two systems. Generally each data word 4 transmitted by system 2 should be received by system 5 exactly once. Further, system 2 generally has to keep the data word 4 stable while flip-flops in system 5 sample the data word.

A clock domain may be defined as that part of an integrated circuit having a group of sequential circuit elements driven by a common clock. Generally, sequential circuit elements driven by clocks having variable phase and time relationships may be partitioned into a plurality of clock domains. FIG. 2, depicts a CPU or ASIC design incorporating multiple clock domains 10, 12 on an integrated circuit 14. A plurality of clock domains may be employed for a variety of reasons including relaxed timing constraints, increased performance and reduced power consumption.

The CPU or ASIC may employ an input/output (I/O) interface 11 driven by a clock whose frequency may be defined by an industry standard (e.g., PCI Express). Such I/O clock frequencies may be limited to a few hundred megahertz. Other portions of the CPU or ASIC may be designed to operate at very high clock frequencies, typically several gigahertz, for performance reasons. Additionally, portions of the CPU or ASIC may be driven by separate clocks to ease the problem of clock skew across the CPU or ASIC. When a signal 16 crosses clock domains, it generally has to be properly handled to avoid the loss of signal values and/or avoid signal instability in the receiving clock domain.

Generally, each clock domain may have several sequential circuit elements such as flip-flops and/or latches. If the data input to a sequential element changes too close to a clock edge, the sequential element may become metastable, resulting in an output state that cannot be reliably used. Thus, the proper operation of the clocked flip-flop may depend on the input being stable for a certain period of time before and after the clock edge (i.e., the set-up and hold times of the sequential element). If the setup and hold times are not met, the output of the flip-flop may take a very long time to reach a valid logic level (referred to as unstable behavior or metastability).

FIG. 3A illustrates a situation that may lead to a metastable output on a flip-flop when a signal is propagated between two clock domains 22, 28. A signal D may be propagated by flip-flop 20 in a clock domain 22, driven by a clock 24, to a flip-flop 26, in a receiving clock domain 28, driven by a clock 30. The flip-flop 26, driven by the clock 30 may sample the output 32 of the flip-flop 20 while the output 32 is changing (for example, at the rising edge of clock 24 and falling edge of output 32) resulting in metastability. The propagation of the signal 32 into the clock domain 28 may be considered an asynchronous signal, i.e., no constant phase and time relationship exists between the clock 24 and the clock 30.

FIG. 3B depicts a timing diagram for the circuit of FIG. 3A. Waveform 35 may be the CLKA input to flip-flop 20. Waveform 36 may be the output 32 of flip-flop 20 being propagated from clock domain 22 to clock domain 28. Waveform 37 may be the CLKB signal applied to the clock input 30 of synchronizer flip-flop 26. Waveform 38 may be the resulting output signal 34 of synchronizer flip-flop 26. Because the input signal 36 of synchronizer flip-flop 26 may be changing when the clock edge 39 occurs, the output 38 of the synchronizer flip-flop 26 may become metastable. Generally metastability cannot be avoided, but proper handling of the metastable signal may enable proper circuit operation.

One current approach to handling a data signal crossing clock domains may involve the use of an asynchronous interface. FIG. 4 depicts the use of a second synchronizer flip-flop 40 that may reduce the effects of any metastable behavior of flip-flop 26. The second synchronizer flip-flop 40 may create a more stable (i.e., less risk of metastability) signal 42 that may be used in the downstream logic 44. However, use of a second synchronizer flip-flop 40 may introduce additional latency. For example, two or more clock cycles (i.e., two or more synchronizer flip-flops) may be necessary to transfer the data from the clock domain 22 to the clock domain 28 resulting in lower performance. Data may also be transferred across clock domains by storing the data in a fifo (first-in, first-out buffer) that may employ a control signal passing through two flip-flops. The two flip-flops may buy enough time to reduce the risk of metastability but may also result in increased signal latency.

What is needed is a method for reliably transferring data between clock domains that does not use asynchronous interfaces. What is further needed is a method for transferring data between clock domains that minimizes latency.

SUMMARY

One aspect of the present invention involves an automatic phase detection circuit for clocks. The circuit includes a sequential state element having a data input, a first clock input and a data output. A first clock is operably coupled to the data input of the sequential element and a second clock is operably coupled to the first clock input of the sequential element. The circuit further includes a serial input, parallel output shift register having a second clock input operably connected to the second clock. The serial input is connected to the data output of the sequential element. The circuit further includes a signature register to store a repetitive portion of the output sequence of the data output of the sequential element and a comparator to compare the content of the shift register with the signature register and generate a sync pulse when the content matches the signature register.

Another aspect of the present invention involves a method of performing automatic phase detection for clocks with a certain frequency ratio. The method involves receiving a first clock signal and a second clock signal. The method further involves identifying the repetitive sequence that occurs when the first clock signal is used to sample the logic state of the second clock signal. Finally, the method involves sampling the second clock signal on each active edge of the first clock signal to obtain a sample sequence and generating a sync pulse when the sample sequence matches the repetitive sequence.

Yet another aspect of the present invention involves a programmable clock module having a first clock input and a second clock input. The module includes a sequential state element, a serial input port, parallel output port shift register, an n-bit comparator and an n-bit mask register. The serial input port of the shift register is connected to the data output of the sequential state element. The clock inputs of the sequential state element and the shift register are connected to the second clock input of the module. The data input of the sequential state element is connected to the first clock input of the module. The comparator compares the content of the shift register with a pre-defined signature and generates a pulse when the content of the shift register matches the pre-defined signature. The mask register is connected to the comparator and is configured to mask a portion of the comparison.

BRIEF DESCRIPTION OF THE DRAWINGS

FIG. 7 depicts a shift register sequence for the circuit of FIG. 5.

DETAILED DESCRIPTION OF EMBODIMENTS OF THE INVENTION

An automatic phase detection circuit may be employed by one embodiment of the present invention to internally generate a sync signal given two input clock signals. The automatic phase detection circuit may be employed to allow reliable transfer data between two clock domains. One clock domain may have a higher frequency clock (the fast clock domain) than the other clock domain (the slow clock domain). The automatic phase detection circuit may generate an internal sync pulse identifying when the two clocks achieve a certain phase relationship. This phase relationship may be referred to as time "zero." Once time "zero" has been determined, the phase relationship between the two clocks may become deterministic and the time windows during which data may be transferred across the two clock domains may be determined (i.e., on which clock edges of the clock employed in the fast clock domain to capture data from or to transfer data to the slow clock domain). It should be understood that even though the two clocks may be derived from a common clock crystal, the phase relationship of the two clocks may change from clock cycle to clock cycle. Thus, the embodiment may determine time "zero" for the two clocks to enable reliable data transfer across the two clock domains.

While an external reference signal (i.e., a sync signal passed between the two clock domains) may be used to mark time "zero" in both clock domains, propagation of such a reference signal may require additional circuitry, may reduce timing margins and/or may not be available. The increasing clock frequencies of modern circuit designs may result in increasingly smaller time windows for data transfers to occur and/or larger relative skew contributions that reduce timing margins when using an external reference signal to mark time "zero.".

Figure 1:
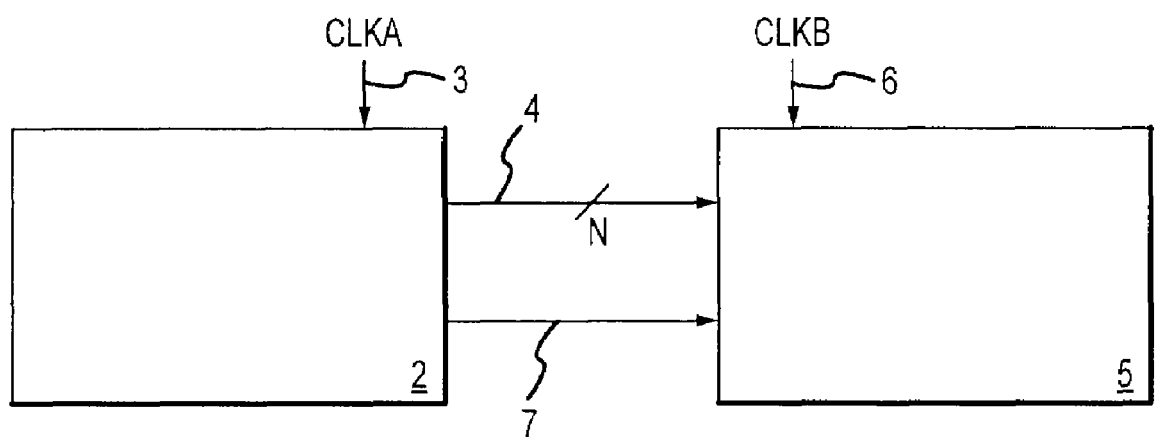
FIG. 1 depicts an asynchronous data transfer scenario between two systems controlled by two independent clocks.
Figure 2:
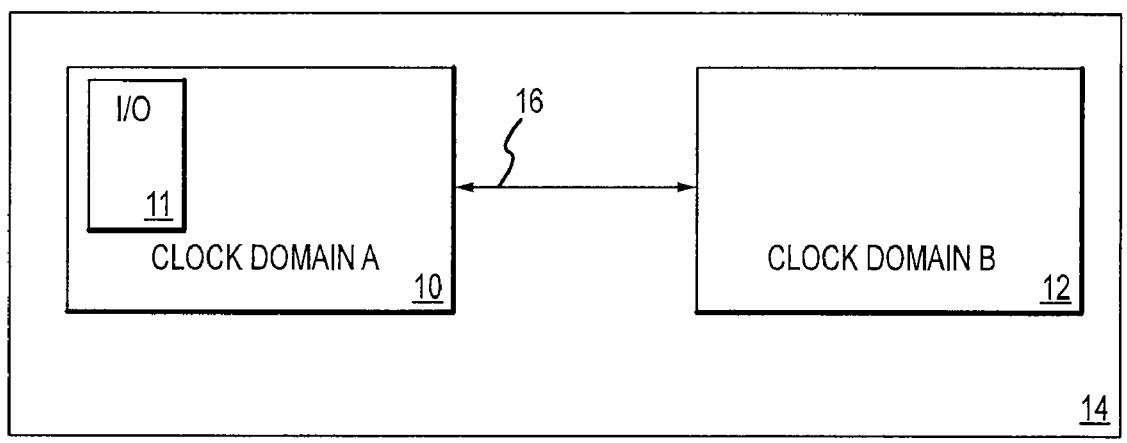
FIG. 2 depicts an integrated circuit with multiple clock domains.
Figure 3A:
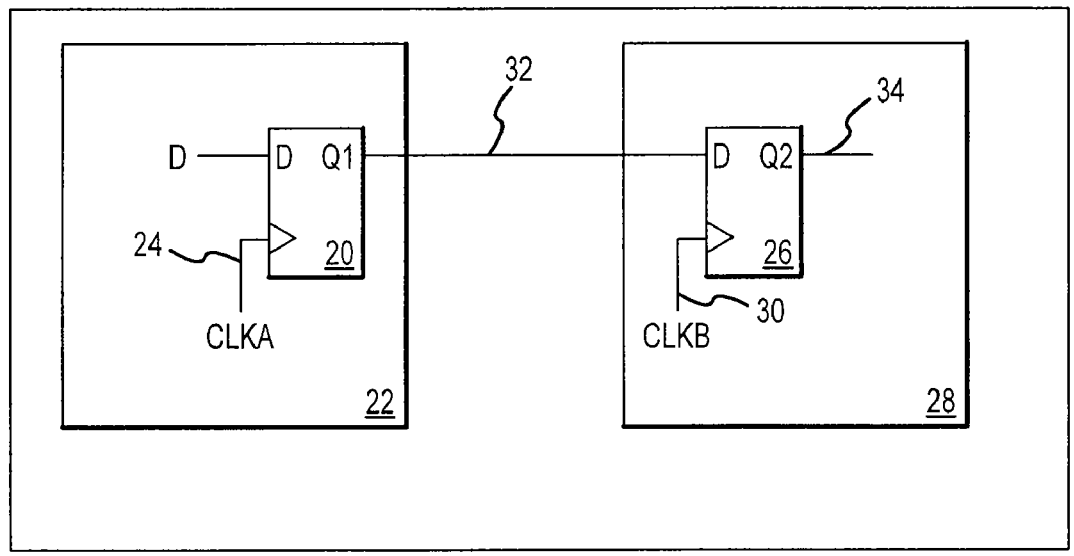
FIG. 3A depicts a circuit configuration that may have a metastable signal.
Figure 3B:
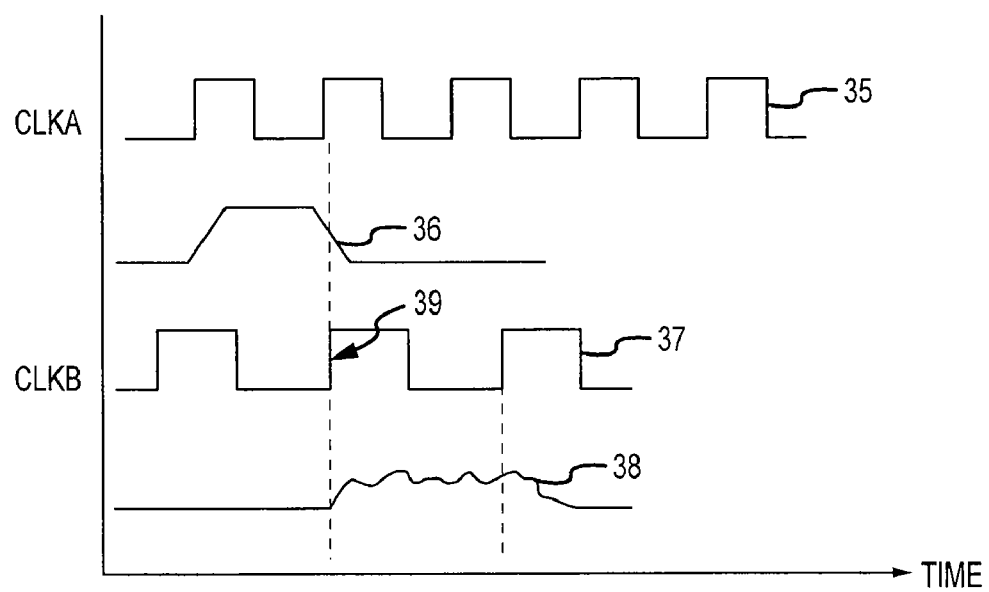
FIG. 3B depicts a timing diagram of the circuit of FIG. 3A illustrating a metastable output signal.
Figure 4:
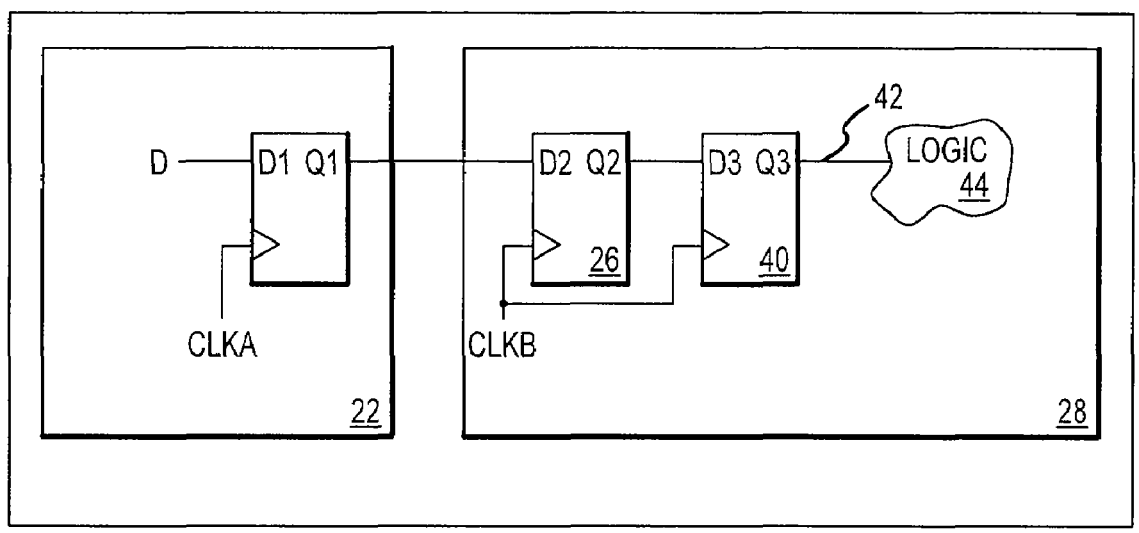
FIG. 4 depicts a circuit that employs a second synchronizer flip-flop.
Figure 5:
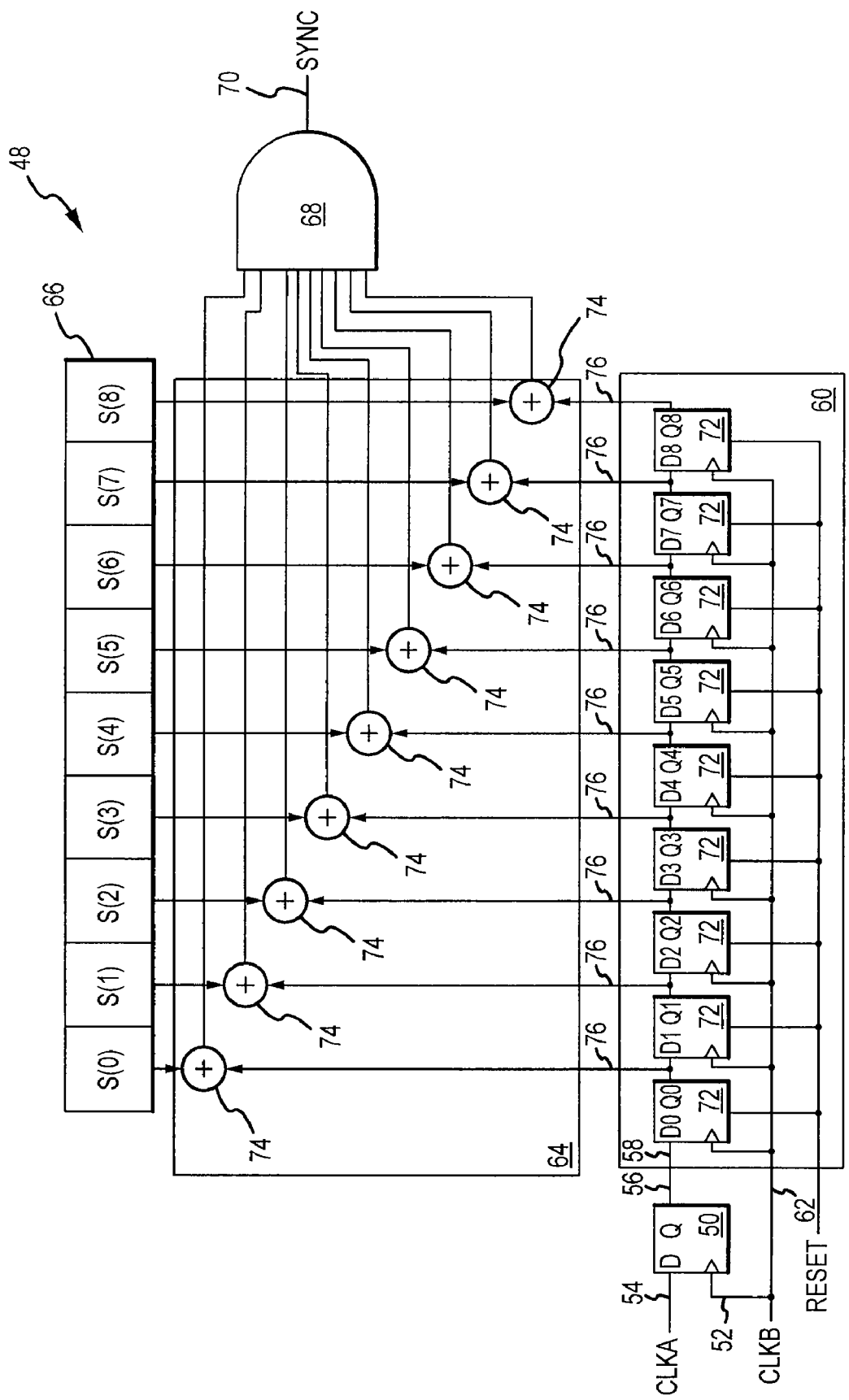
FIG. 5 depicts an embodiment of an automatic phase detection circuit.

FIG. 5 depicts one embodiment that may be used to detect the phase relationship and timing of two input clock signals having a frequency ratio such that the edges of the two clocks align periodically (i.e., after a finite number of clock periods of either clock). The embodiment may determine the time zero phase relationship of the two input clock signals using only the two input clock signals.

The embodiment may employ a flip-flop 50, a shift register 60, a comparator circuit 64, a signature register 66 and an AND gate 68. The higher frequency clock input signal CLKB (fast clock signal) may be used to sample the state of the lower frequency clock signal CLKA (slow clock signal). The sampled state may be stored in the shift register. When the shift register contents match a predefined signature stored in the signature register, the output of the AND gate may generate an internal sync pulse 70 marking time zero, as described in more detail below.

Generally, the two clocks may have a repetitive pattern such that the clock edge of one clock will align with an edge of the other clock every finite number of clock cycles. Thus, once time zero is determined, the clocks may align every N clock cycles of the fast clock and every D clock cycles of the slow clock, i.e., the clock ratio, expressed as the frequency of the fast clock divided by the frequency of the slow clock, may be represented by N/D (a ratio having an integer valued numerator and denominator).

Typically, in a chip employing a plurality of clocks, the clock frequencies may be picked in such a way that the clock ratio is an integer value. For example, data communication with an external device may employ a 200 MHz I/O clock frequency. The other clock frequency may be the internal high frequency clock that drives the internal chip circuitry at the higher frequency for performance reasons. The on-chip phase-locked loop used to generate clock frequencies may perform a divide by four and may allow multiplication in the range of four to 12. The technology and number of logic levels of the chip may limit the maximum frequency to 480 MHz. To achieve maximum performance, the two clocks may be chosen as 200 MHz (the I/O clock) and 450 MHz (the internal clock) (200 MHz divided by four and multiplied by nine, the highest integer value that will not exceed the maximum frequency). This results in an integer valued clock ratio of nine to four.

The embodiment depicted in FIG. 5 may generate an internal sync signal denoting time "zero." An external reference signal is not needed to mark time "zero." Typically, the two clocks may be derived from a common crystal reference to minimize long term drift between the two clocks.

The embodiment depicted in FIG. 5 may be referred to as an automatic phase detection circuit 48. A sequential element 50, such as a D-type flip-flop, may be used to sample a slower clock CLKA with a faster clock CLKB. The faster clock CLKB may be applied to the clock input 52 of the flip-flop 50. The slower clock CLKA may be applied to the D input 54 of the flip-flop 50. The output sequence (pattern) on the output 56 of the flip-flop 50 may be repetitive and may repeat with a particular period. For example, when the two clocks CLKB, CLKA have a ratio of nine to four, the output 56 of the flip-flop 50 may repeat after nine CLKB clock cycles (or four CLKA clock cycles).

The input 58 of a serial input/parallel output shift register 60 may be connected to the output 56 of the flip-flop 50. Some embodiments may implement the shift register 60 as a chain of D-type flip-flops 72, as shown in FIG. 5. The use of D-type flip-flops is by way of illustration and not limitation. Any suitable serial input/parallel output shift register may be used. The shift register 60 may be clocked by applying CLKB to the clock input 62. The logic state of the CLKA clock may be captured by the flip-flop 50 on each active edge of the CLKB clock and stored by the shift register 60. The repetitive output pattern, generated by the flip-flop 50, may be captured in a shift register including at least as many stages as the larger integer value of the clock ratio of the two clocks CLKB, CLKA. For example, a CLKB clock frequency of 450 MHz and a CLKA clock frequency of 200 MHz has a clock ratio of nine to four and a shift register including at least nine stages may be employed to capture the repetitive portion of the output sequence from the flip-flop 50. Other combinations of clock frequencies with a nine to four ratio may include 1.8 GHz and 800 MHz, 900 MHz and 400 MHz, 750 MHz and 333.3333 MHz, etc. More or fewer shift register stages may be used to capture the repetitive output patterns for other clock ratios. For example, a clock ratio of 11 to seven may use a shift register including at least 11 stages to capture the repetitive output pattern that repeats every 11 fast clock cycles.

A comparator 64 may be used to compare the output pattern of flip-flop 50 stored in the shift register 60 with a predefined signature, stored in a signature register 66 having the same number of bits as the shift register 60. The comparison may be performed on every CLKB clock cycle. The predefined signature may be determined as described below. Initially, the shift register 60 may be reset, for example, to all zeroes by enabling the RESET input. Then, the output sequence from the flip-flop 50 may be shifted into the shift register on each CLKB active clock edge. The time "zero" phase relationship and timing between the two clocks CLKA, CLKB may occur when the contents of the shift register 60 matches a predefined signature stored in the signature register 66.

The comparator 64 may employ individual exclusive-or (XOR) gates 74 to perform a bit by bit comparison of the signature, held in the signature register 66, with the contents of the shift register 60 (i.e., the output sequence from the flip-flop 50). An AND gate 68 may be used to combine the outputs of the XOR gates 74 to generate an internal sync signal 70. In one embodiment, an n-input AND gate may be used to combine the outputs of the XOR gates 74, where n is equal to the number of stages (bits) in the shift register 60. When the contents of the shift register and signature register match, the output 68 of the AND gate transitions to a logic one, as depicted by waveform 86 of FIG. 6. The rising (active) edge of the sync pulse may represent time "zero."

Figure 6:
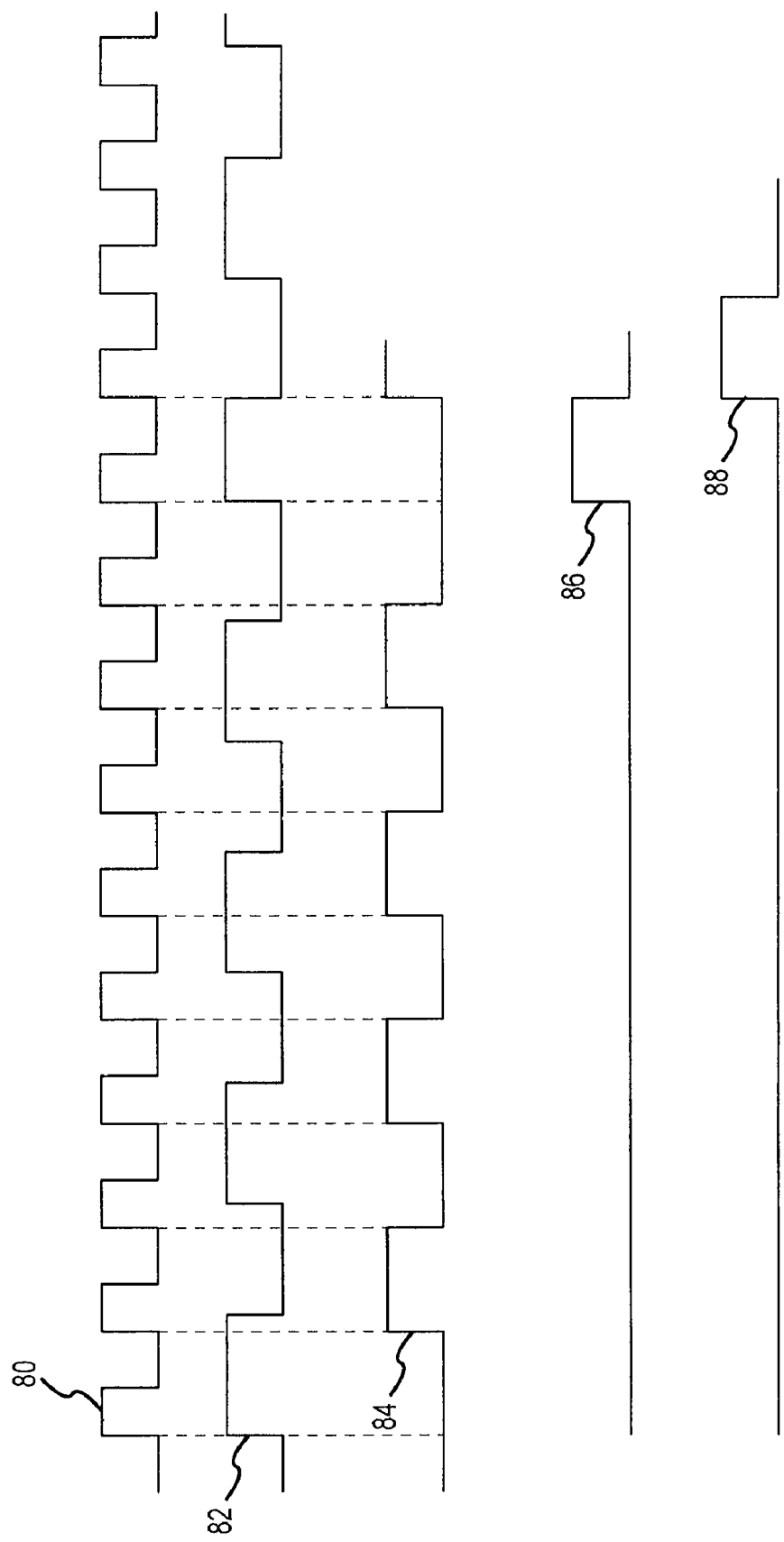
FIG. 6 depicts a timing diagram for the circuit of FIG. 5.

FIG. 6 depicts a timing diagram of the automatic phase detection circuit depicted in FIG. 5 for a clock ratio (fast clock CLKB to slow clock CLKA) of 9 to 4. The CLKB clock, depicted by waveform 80, may drive the clock input 52 of the flip-flop 50 and the clock input 62 of the shift register 60. The low frequency clock CLKA, depicted by waveform 82, may be applied to the input 54 of the flip-flop 50. Waveform 84 depicts the output 56 of the flip-flop 50. It should be understood that the waveform 84 generally repeats every nine CLKB clock cycles (or every four CLKA clock cycles). This repeating sequence may be represented as a sequence of logic ones and zeroes (i.e., 010101010010101010100101 . . . for the nine to four ratio depicted). The repetitive portion of the sequence, 010101010 for the nine to four ratio, may be used as the predefined signature stored in the signature register 66 to determine time "zero." It should be understood that a signature for any clock ratio may be predetermined by converting the repetitive portion of the output waveform of the flip-flop 50 into a corresponding sequence of logic zeroes and ones. For example, a clock ratio of four to one may have a predefined signature of 0110.

Time "zero" may be determined as follows. First, the signature (for a given clock ratio, e.g., 010101010 for a nine to four ratio) may be stored in the signature register 66. Next, the shift register 60 may be reset. Then, the output 56 from the flip-flop 50 may be shifted into the input 58 of the shift register 60 using the CLKB clock. As the output 56 from the flip-flop 50 is shifted into the shift register 60, the parallel outputs 76 of the shift register (output sequence from the flip-flop 50) may be compared with the signature register 66. FIG. 7 depicts one possible sequence 90 for the shift register contents, starting from a reset condition. On each rising edge of CLKB, the shift register 60 captures and stores the output 56 of the flip-flop 50. It should be understood that the repetitive sequence captured by the shift register 60 may start at any point within the repetitive sequence. Eventually, the contents of the shift register 60 and the contents of the signature register 66 match, denoting time "zero."

The use of CLKB to sample the state of the CLKA generally imposes timing constraints on the two clocks to minimize metastable behavior of the flip-flop 50. A metastable output may interfere with the proper determination of the time "zero." Generally, the setup time and hold time of the flip-flop 50 should be met. The setup time may be defined as the time from when a state change (i.e., a logic zero to a logic one transition or a logic one to a logic zero transition) of CLKA occurs to when a rising edge on CLKB occurs. The hold time may be defined as the time from when a rising edge on CLKB occurs to when a state change on CLKA occurs. Should a timing violation occur, the phase of one clock relative to the phase of the other clock may be shifted to allow the particular setup and/or hold time violation to be fixed, as long as the other clock edges of CLKB used to sample CLKA have sufficient timing margins. The phase shifting may be performed by delaying the CLKA clock relative to the CLKB clock, or vice versa. This delay (or phase shift) may occur locally and may not affect the clock distribution network on the chip. While the sampling of CLKA using CLKB has been illustrated employing active high clock circuitry, alternative embodiments may employ active low clock circuitry.

Various embodiments may employ a programmable delay line to shift the slower clock relative to the faster clock. This may be useful, for example, when the two clocks have transitions at or near the same time that may result in a violation of the setup/hold time of the flip-flop 50, resulting in a metastable output for that particular clock cycle. By shifting the transition of the slower clock edge relative to the faster clock edge, the setup/hold time of the flip-flop may be met, i.e., the faster clock edge occurs after the slower clock changes state so as to meet the setup time and the edge occurs before the slower clock changes state so as to meet the hold time. The amount of delay needed may be predetermined given the deterministic phase relationship of the two clocks. Generally, this involves analyzing the setup/hold times of the edges of the data transfers and the other edges. If one of the setup/hold times is violated and there is a hold/setup margin, hold/setup time may be traded for setup/hold time by shifting one of the clocks. For example, a particular edge of a data transfer may have a hold time that is greater than the minimum hold time of the capture flip-flop, resulting in a hold margin that is equal to the hold time minus the minimum hold time. If the setup time of the capture flip-flop for this particular edge is less than the minimum setup time, the clock may be shifted by as much as the margin, effectively trading hold time for setup time. Typically, all edges are checked and the minimum margin for any of the edges determines by how much the clock can be shifted without violating the timing constraints of the capture flip-flop.

Figure 8:
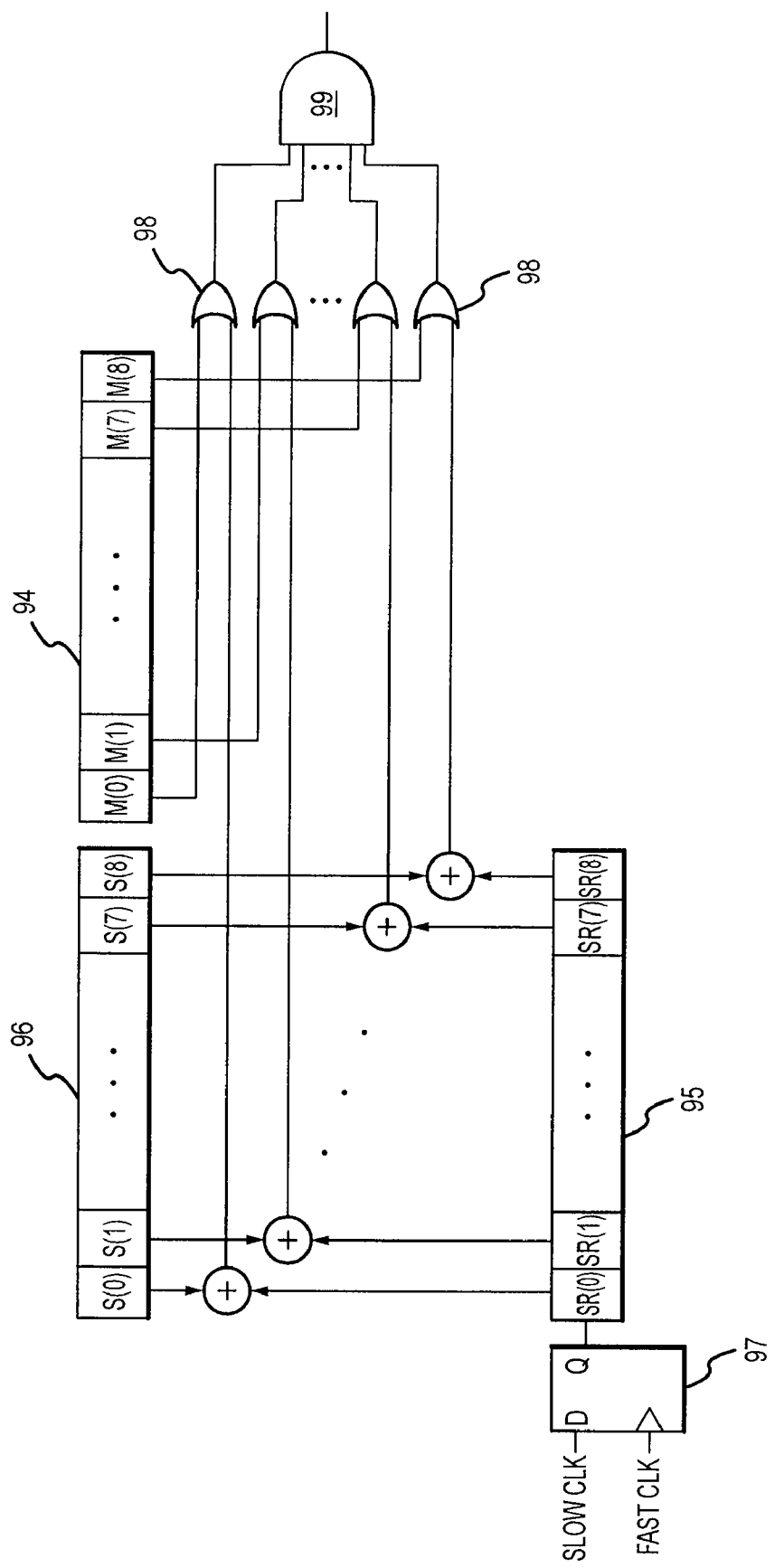
FIG. 8 depicts a second embodiment of an automatic phase detection circuit employing a mask register.

Alternatively, as depicted in FIG. 8, various embodiments may employ a mask register 94 to minimize flip-flop 97 metastability issues. The mask register 94 may define which bits of the shift register 95 and signature register 96 determine time "zero". The corresponding bit in the mask register may be set, for example, when the corresponding output bit of the flip-flop 97 may be metastable due to a timing violation. A set bit in the mask register 94 indicates that the corresponding output bit of the repetitive pattern of the flip-flop 97 should be ignored by the comparator circuit. In one embodiment, a two input OR gate 98 may be employed to combine a mask register bit with the corresponding comparator output bit. Each OR gate output may be connected to an input of an AND gate 99. Setting a particular mask bit to a logic one state results in the corresponding OR gate output being set to a logic one state, effectively masking the corresponding bit in the shift register 95 (i.e., the corresponding shift register bit is not used to determine the time "zero").

Once time "zero" has been determined, the timing relationship between the clocks becomes deterministic. This deterministic relationship may be used to transfer data across the clock domains on the appropriate edges of the CLKB clock, i.e., those active edges which meet the relevant setup and hold time constraints. The transition of the CLKA clock to the rising edge of the CLKB clock generally should satisfy the setup time constraint. The rising edge of the CLKB clock to the CLKA clock transition generally should meet the hold time constraint. The CLKB clock edges satisfying the set up and hold time constraints may be employed. These CLKB edges may be predetermined for a specified clock ratio.

Figure 9:
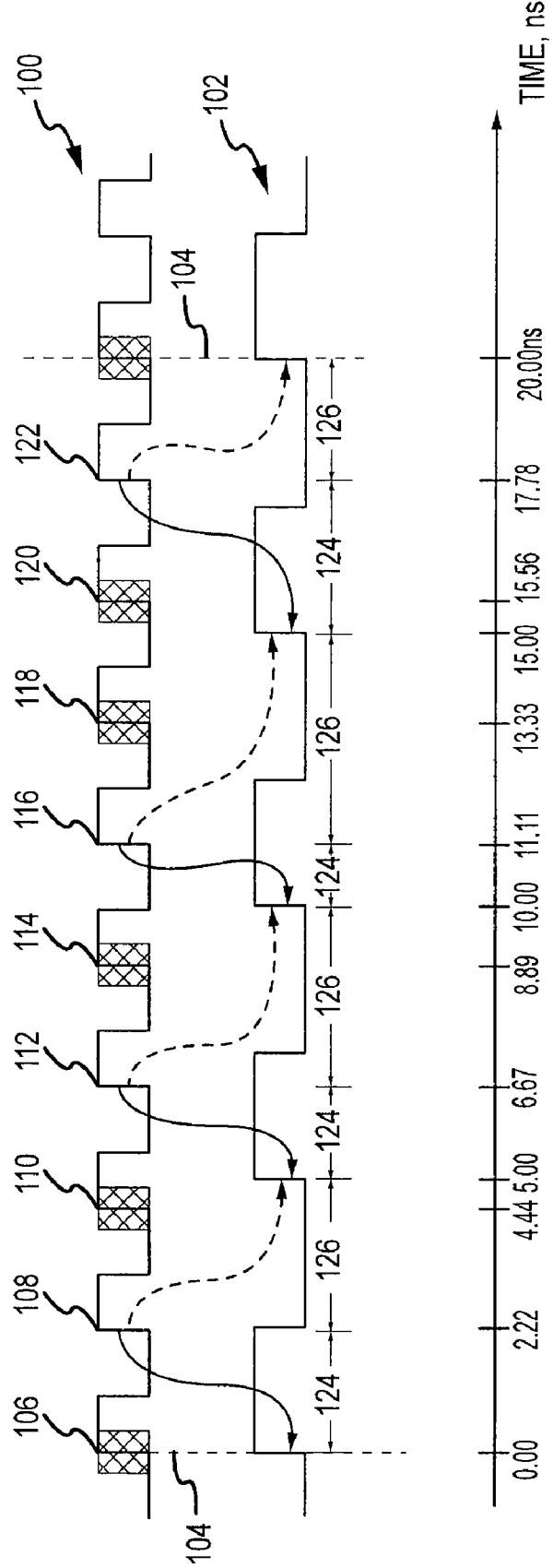
FIG. 9 depicts a clock domain crossing timing diagram for a 450 MHz fast clock and a 200 MHz slow clock.

FIG. 9 illustrates a clock domain crossing timing diagram for a nine to four clock ratio employing a 450 MHz fast clock 100 and a 200 MHz slow clock 102. Time "zero" 104 may denote when the two clocks 100, 102 achieve a certain phase relationship (the phase relationship detected by the automatic phase detection circuit). This certain phase relationship is repetitive. For a nine to four clock ratio, the certain phase relationship occurs once every nine clock cycles of clock 100 (or once every four clock cycles of clock 102).

The repetitive period for the two clock waveforms 100, 102 may be examined to determine which four of the nine clock edges of clock 100 that occur during the repetitive period may be used to reliably transfer data to or capture data from the slow clock domain (for a 9 to 4 clock ratio). It should be understood that the maximum number of data values to be transferred during the repetitive period may be set by the number of available clock cycles of clock 102 that occur within the period. The clock 100 generally has additional clock cycles, some of which may be unsuitable for data transfer. That is, for a nine to four ratio, there are nine potential clock 100 edges available to transfer four data values.

For example, clock 100 rising edges 108, 112, 116, 122 may be used to transfer data to or capture data from the slow clock domain. Clock 100 rising edges 110, 114, 118 may clock the same data value as the prior clock edge and should not be used (to avoid double clocking the same data value). Clock 100 edges 106, 120 may be inappropriate due to possible setup time violations. It should be understood that there are nine potential clock 100 rising edges that may be used to capture four data values from the slow clock domain or to transfer four data values to the slow clock domain (because four clock cycles occur on clock 102 for every nine clock cycles that occur on clock 100). Thus, for the timing relationship depicted in FIG. 9, once time "zero" occurs, fast clock edges 108, 112, 116, 122 of the repetitive pattern may be used in the fast clock domain to transfer data to or capture data from the slow clock domain.

A fast clock rising edge (for an active high clock) meeting setup and hold time constraints may be an appropriate transfer window in the fast clock domain to capture/transfer data from/to the slow clock domain. The time from the rising edge of the clock 100 in the fast clock domain to the prior rising edge of the clock 102 in the slow clock domain may determine the hold time 124 for a data transfer from the fast clock domain to the slow clock domain (or setup time for a data transfer from the slow clock domain to the fast clock domain) for a transfer window. The time from the rising edge of the clock 100 in the fast clock domain to the next rising edge of the clock 102 in the slow clock domain may determine the setup time 126 for a data transfer from the fast clock domain to the slow clock domain (or the hold time for a data transfer from the slow clock domain to the fast clock domain) for a transfer window.

As depicted by the timing diagram of FIG. 9, the hold times for transfers from the fast clock domain to slow clock domain (or setup times for transfers from the slow clock domain to the fast clock domain) for clock edges 108, 112, 116, 122 may be 2.22 ns, 1.67 ns, 1.11 ns and 2.78 ns, respectively. The setup times for transfers from the fast clock domain to the slow clock domain (or hold times for transfers from the slow clock domain to the fast clock domain) may be 2.78 ns, 3.33 ns, 3.89 ns and 2.22 ns, respectively. It should be noted that other delays including D to Q propagation delay, rise/fall times and clock jitter have been ignored for purposes of clarity. Now that time "zero" may be detected and the appropriate clock edges of clock 100 (which identify the data transfer windows) may be identified, the appropriate windows on which to transfer data may be determined by counting clock 100 clock cycles starting at time "zero." Given the repetitive nature of the output of the flip-flop, the counting sequence may be repetitive.

Figure 10:
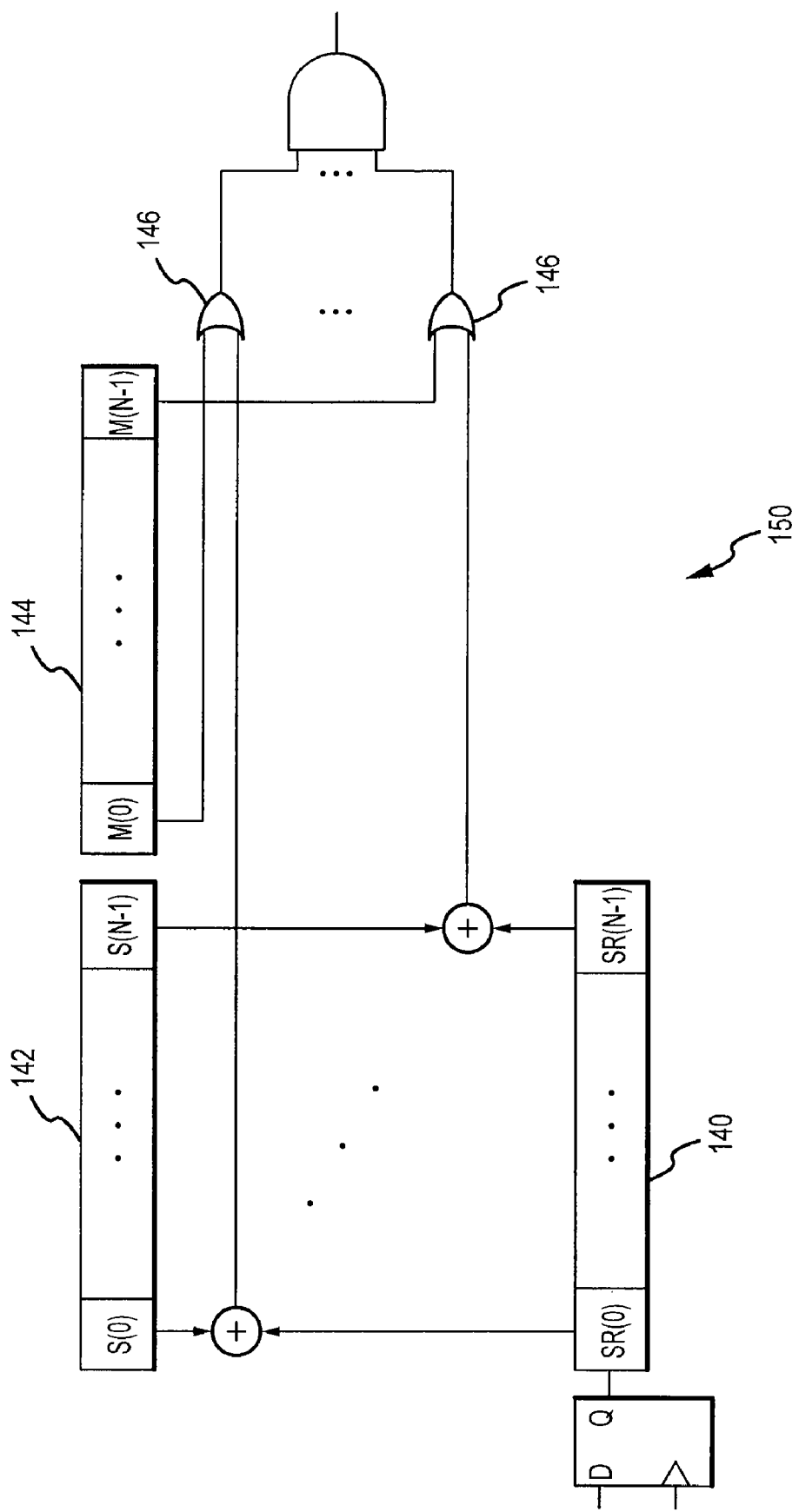
FIG. 10 depicts an embodiment of a programmable clock module.

Various embodiments, as depicted in FIG. 10, may employ a shift register 140, a signature register 142 and a mask register 144 that each include more stages (or bits) than may be needed for a particular clock ratio. For example, the shift register 140, the signature register 142 and the mask register 144 may each have n bits to allow automatic phase detection of clocks with a variety of clock ratios, where n may be the largest integer value of the clock ratios (e.g., for ratios varying from nine to four up to 25 to 19, each register would have 25 bits). When a particular clock ratio does not use all of the bits, the high order bits may be turned off (disabled) by setting the corresponding mask bits to a logic one state (causing the corresponding output of the OR gate 146 to be at a logic one state). This may effectively disable the corresponding bit comparison of the shift register 140 and signature register 142 (the corresponding bit comparison effectively indicates a match). Alternatively, certain embodiments may repeat the pattern in signature register 142 to fill all n bits. For example, for a nine to four ratio and 25 bit shift, mask and signature registers, the signature register may be programmed with the pattern 0101010100101010100101010. In this case, all 25 bits of the mask register may be set to a logic zero state.

The circuit depicted in FIG. 10 may be referred to as a programmable clock module 150 that may be programmed for a variety of clock ratios. The size of the shift register 140, the signature register 142, and the mask register 144 may each include sufficient bits to cover the expected range of clock ratios. The programmable clock module 150 may be employed, for example, in an integrated circuit that due to manufacturing tolerances, may be sorted into various operating speed ranges. Once the integrated circuit has been sorted into a particular speed range, the clock module may be programmed for the resulting clock ratio. The clock ratio of the sorted integrated circuits may vary, for example, because the clock frequency for one clock domain may be fixed by an interface standard specifying the clock frequency for I/O pins while the internal clock frequency of a second clock domain may vary because of manufacturing process variations. Once the individual integrated circuit has been categorized for operating speed, i.e., the maximum internal clock frequency has been determined, the shift register, signature register and mask register of the chip clock module may be programmed during chip initialization for the appropriate clock ratio.

Various embodiments may allow the position of the sync pulse relative to time "zero" to be shifted such that the sync pulse occurs on another fast clock rising edge, effectively shifting when time "zero" occurs. This may be done by either rotating the signature stored in a fixed length signature register or by shifting the signature to higher bit positions in a variable length signature register. For example, referring back to FIG. 5, rather than storing the pattern 010101010 (i.e., S(0) . . . S(8)) in the signature register 66 for a nine to four clock ratio, the pattern 001010101 may be stored. After resetting the shift register, the output sequence of the flip-flop may be shifted into the shift register 60. A sync pulse 70 may be generated one fast clock cycle later as shown by waveform 88 of FIG. 6.

Alternatively, when a variable length signature register is used, a mask register may be programmed to indicate which signature register bit positions to use during the comparison. If the pattern programmed in the signature register bits S(0) to S(r) may be used during a comparison to generate a sync pulse on a particular clock cycle, the signature register bits S(1) to S(r+1) may be programmed with the same pattern shifted by one bit to generate a sync pulse one clock cycle later. The mask register may be programmed so that signature register bits S(1) to S(r+1) are used during the comparison to generate a sync pulse one clock cycle later. For example, the variable length signature register may be set to x01010101010xxx . . . x for a nine to four clock ratio, where x indicates a don't care bit masked during the comparison. As the output sequence from the flip-flop is shifted into the shift register, a sync pulse will occur one fast clock cycle later when the shift register and signature register match. Certain embodiments may instead rotate a repeated pattern to shift the position of the sync pulse.

Although the present invention has been described with respect to particular embodiments and operations, it should be understood that changes to the described embodiments and/or operations may be made and yet still embraced by alternative embodiments of the invention. For example certain embodiments have been described using a clock ratio of nine to four. This is by way of illustration only and not limitation. Any clock ratio or combination of clock ratios may be utilized by various embodiments. Accordingly, the proper scope of the present invention is defined by the claims herein.

What is claimed is:

1. An automatic phase detection circuit for clocks, comprising:
   a sequential state element having a data input, a first clock input and a data output;
   a first clock operably coupled to the data input;
   a second clock operably coupled to the first clock input;
   a serial input, parallel output shift register having a second clock input operably coupled to the second clock and the serial input operably coupled to the data output;
   a signature register configured to store a repetitive portion of an output sequence of the data output;
   a comparator operably coupled to the parallel output of the shift register and operably coupled to the signature register, the comparator configured to compare a content of the signature register and a content of the shift register; and
   wherein the comparator generates a pulse when the content of the signature register and the content of the shift register match.

2. The automatic phase detection circuit of claim 1, wherein a first frequency of the first clock and a second frequency of the second clock have a phase relationship that repeats every D first clock cycles and every N second clock cycles such that a clock ratio of the second clock frequency to the first clock frequency is equal to N/D.

3. The automatic phase detection circuit of claim 2, wherein the shift register, comparator and signature register each are of length N bits.

4. The automatic phase detection circuit of claim 1, further comprising a mask register circuit coupled to the comparator to mask a portion of the comparison such that the masked portion is not used to generate the pulse.

5. The automatic phase detection circuit of claim 4, wherein masking a portion of the comparison is performed on a bit level.

6. The automatic phase detection circuit of claim 2, wherein the repetitive portion of the output sequence is determined as that portion of the output sequence beginning when an active edge of the first clock and an active edge of the second clock align and ending after N second clock cycles.

7. The automatic phase detection circuit of claim 1, wherein the repetitive portion of the output sequence is rotated in the signature register.

8. A method of performing automatic phase detection for clocks with a certain frequency ratio, the method comprising:
receiving a first clock signal and a second clock signal;
identifying a repetitive sequence that occurs when an active edge of the first clock signal is used to sample a logic state of the second clock signal;
sampling the second clock signal on each active edge of the first clock signal to obtain a sample sequence; and
generating a sync pulse when the sample sequence matches the repetitive sequence.

9. The method of claim 8, wherein the repetitive sequence repeats after a finite number of second clock signal cycles.

10. The method of claim 8, wherein the operation of sampling comprises using a D-type flip-flop to sample the second clock signal on each active edge of the first clock signal.

11. The method of claim 8, further comprising storing the repetitive sequence in a register.

12. The method of claim 8, further comprising storing the sample sequence in a serial in, parallel out shift register.

13. The method of claim 8, wherein the generating operation further comprises performing a comparison of the sample sequence with the repetitive logic sequence on a bit by bit basis.

14. The method of claim 13, further comprising masking one or more bits of the comparison.

15. A programmable clock module having a first clock input and a second clock input, comprising:
a sequential state element having a data input operably coupled to the first clock input, a data output and a clock input operably coupled to the second clock input;
a serial input port, parallel output port n-bit shift register having a clock input port, the clock input port operably coupled to the second clock input and the serial input port operably coupled to the data output;
an n-bit comparator operably coupled to the shift register and configured to compare a content of the shift register with a pre-defined signature;
an n-bit mask register operably coupled to the comparator and configured to mask a portion of the comparison; and
wherein the comparator generates a pulse when the content of the shift register matches the pre-defined signature.

16. The programmable clock module of claim 15, wherein the pre-defined signature is stored in a signature register, the pre-defined signature is a repetitive pattern and the mask register is configured to mask corresponding unused bits of the signature register.

17. The programmable clock module of claim 16, wherein the repetitive pattern is a length r-bits, r is less than or equal to n, and the n–r high order bits of the mask register are configured to mask the corresponding bits of the comparison.

18. The programmable clock module of claim 16, wherein the repetitive pattern is a repetitive portion of a logic state pattern determined by sampling a logic state of the first clock input on each active edge of the second clock input.

19. The programmable clock module of claim 18, wherein a clock ratio of the second clock frequency to the first clock frequency is F/S and wherein the logic state pattern repeats every F second clock cycles and every S first clock cycles.

20. The programmable clock module of claim 19, wherein n is greater than or equal to F.

21. The programmable clock module of claim 16, wherein the pre-defined signature is shifted to a higher location in the signature register.

22. The programmable clock module of claim 16, wherein the pre-defined signature is replicated to fill all bits of the signature register.

* * * * *